(12) United States Patent
Woo et al.

(10) Patent No.: US 9,470,923 B2
(45) Date of Patent: Oct. 18, 2016

(54) IN-CELL TOUCH LIQUID CRYSTAL DISPLAY DEVICE AND METHOD OF MANUFACTURING THE SAME

(71) Applicant: LG Display Co., Ltd., Seoul (KR)

(72) Inventors: Yoon Hwan Woo, Seoul (KR); Young Sik Kim, Gum-si (KR); Yang Ho Cho, Gyeongsangbuk-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/925,041

(22) Filed: Oct. 28, 2015

(65) Prior Publication Data

US 2016/0187692 A1    Jun. 30, 2016

(30) Foreign Application Priority Data

Dec. 31, 2014    (KR) .................... 10-2014-0195948

(51) Int. Cl.
| | | |
|---|---|---|
| *H01L 27/14* | (2006.01) | |
| *G02F 1/1333* | (2006.01) | |
| *G02F 1/1368* | (2006.01) | |
| *G02F 1/1362* | (2006.01) | |
| *H01L 23/522* | (2006.01) | |
| *G06F 3/041* | (2006.01) | |
| *G06F 3/044* | (2006.01) | |
| *H01L 27/12* | (2006.01) | |
| *G02F 1/1343* | (2006.01) | |

(52) U.S. Cl.
CPC ......... *G02F 1/13338* (2013.01); *G02F 1/1368* (2013.01); *G02F 1/133345* (2013.01); *G02F 1/136227* (2013.01); *G06F 3/044* (2013.01); *G06F 3/0412* (2013.01); *H01L 23/522* (2013.01); *H01L 27/1259* (2013.01); *G02F 2001/134372* (2013.01); *G06F 2203/04103* (2013.01); *G06F 2203/04111* (2013.01)

(58) Field of Classification Search
CPC ............... H01L 23/522; G02F 1/1368; G02F 1/136227
See application file for complete search history.

(56) References Cited

U.S. PATENT DOCUMENTS

| 2013/0257794 A1 | 10/2013 | Lee et al. |
|---|---|---|
| 2013/0293791 A1 | 11/2013 | Abe et al. |

OTHER PUBLICATIONS

Ma, J., et al., "Panel Structure Evolution of In-cell Capacitive Touch Sensor" SID Symposium Digest of Technical Papers, Jun. 1, 2015, pp. 1004-1007.

*Primary Examiner* — Douglas Menz
(74) *Attorney, Agent, or Firm* — Fenwick & West LLP

(57) ABSTRACT

Disclosed are an in-cell touch liquid crystal display (LCD) device having a pixel electrode top structure and a method of manufacturing the same. The in-cell touch LCD device includes a thin film transistor (TFT) disposed in each of a plurality of pixel areas, first to fourth passivation layers disposed on the TFT, a common electrode disposed on the second passivation layer, a conductive line disposed on the third passivation layer; a pixel electrode connected to a drain electrode of the TFT and disposed on the fourth passivation layer, and a bridge contact part configured to electrically connect the common electrode to the conductive line.

15 Claims, 11 Drawing Sheets (a)

< Vcom top structure : 11mask >

| mask | layer |
|---|---|
| 1 | light shield layer |
| 2 | active layer |
| 3 | gate layer |
| 4 | S/D contact hole |
| 5 | source / drain layer |
| 6 | PAS0 |
| 7 | PAS1 |
| 8 | pixel electrode |
| 9 | conductive line |
| 10 | PAS2 |
| 11 | common electrode |

FIG. 5

< PXL top structure : 10mask >

| mask | layer |
|------|-------|
| 1 | light shield layer |
| 2 | active layer |
| 3 | gate layer |
| 4 | S/D contact hole |
| 5 | source / drain layer |
| 6 | PAS1 |
| 7 | common electrode |
| 8 | conductive line |
| 9 | PAS0 / PAS2 / PAS3 |
| 10 | pixel electrode |

IN-CELL TOUCH LIQUID CRYSTAL DISPLAY DEVICE AND METHOD OF MANUFACTURING THE SAME

CROSS-REFERENCE TO RELATED APPLICATIONS

This application claims the priority benefit of Republic of Korea Patent Application No. 10-2014-0195948 filed on Dec. 31, 2014, which is hereby incorporated by reference as if fully set forth herein.

BACKGROUND

1. Field of the Invention

The present invention relates to an in-cell touch liquid crystal display (LCD) device having a pixel electrode top structure and a method of manufacturing the same.

2. Discussion of the Related Art

Instead of a mouse or a keyboard which is conventionally applied to flat panel display devices, a touch screen that enables a user to directly input information with a finger or a pen is applied to flat panel display devices. Especially, since all users can easily manipulate the touch screen, the application of the touch screen is being expanded.

A touch screen is applied to monitors such as navigations, industrial terminals, notebook computers, financial automation equipment, and game machines, portable terminals such as portable phones, MP3 players, PDAs, PMPs, PSPs, portable game machines, DMB receivers, and tablet personal computers (PCs), and home appliances such as refrigerators, microwave ovens, and washing machines.

The touch screen may be classified as follows, based on a structure where the touch screen is coupled to a liquid crystal panel. The touch screen may be divided into an in-cell touch type in which the touch screen is built in a cell of a liquid crystal, an on-cell touch type in which the touch screen is disposed on a cell of a liquid crystal panel, an add-on type in which the touch screen is coupled to an outer portion of a display panel, and a hybrid type.

Hereinafter, a touch screen (a touch panel) being coupled to a liquid crystal panel is referred to as a touch display device.

FIG. 1 is a diagram illustrating a related art touch display device to which a touch screen is applied. FIG. 1, part (a) illustrates an add-on type touch display device. FIG. 1, part (b) illustrates a modified add-on type touch display device. FIG. 1, part (c) illustrates a hybrid type touch display device.

In the add-on type touch display device of FIG. 1, part (a) and the modified add-on type touch display device of FIG. 1, part (b), a touch screen is disposed on a liquid crystal panel that includes a thin film transistor (TFT) array substrate 1 and a color filter array substrate 2. A touch driving electrode (a TX electrode) and a touch receiving electrode (an RX electrode) are arranged in the touch screen. In this case, the touch driving electrode (the TX electrode) and the touch receiving electrode (the RX electrode) may be disposed on the same layer or different layers.

In the hybrid type touch display device of FIG. 1, part (c), a touch driving electrode (a TX electrode) is disposed on a TFT array substrate 1, and a touch receiving electrode (an RX electrode) is disposed on a color filter array substrate 2.

In the related art touch display device, since a liquid crystal panel and a touch screen are separately manufactured, a manufacturing process is complicated, and the cost increases.

Recently, an in-cell touch LCD device where a touch electrode (a touch sensor) is built into a cell of a liquid crystal panel has been developed for decreasing a thickness of a touch display device and reducing the manufacturing cost. The in-cell touch LCD device uses a common electrode, which is disposed on a TFT array substrate, as a touch electrode.

FIG. 2 is a diagram illustrating an in-cell LCD device having a mutual capacitive type.

Referring to FIG. 2, the in-cell touch LCD device having the mutual capacitive type uses common electrodes, which are arranged on a TFT array substrate, as a touch driving electrode (a TX electrode) and a touch receiving electrode (an RX electrode).

In the mutual capacitive type, a touch driving line 14 connected to the touch driving electrode (the TX electrode) and a touch receiving line 12 connected to the touch receiving electrode (the RX electrode) are disposed in a left bezel area and a right bezel area of a liquid crystal panel 10, causing an increase in a bezel width.

FIG. 3 schematically illustrates a process of manufacturing an in-cell touch display device having a common electrode top structure and illustrates the number of masks applied to a manufacturing process.

Referring to FIG. 3, in a common electrode top pixel structure, a common electrode is disposed on an uppermost layer in a pixel structure, and a pixel electrode is disposed under the common electrode. Here, a material of an active layer of a TFT may use low temperature poly silicon (LTPS).

In a related art in-cell touch LCD device to which the common electrode top pixel structure is applied, eleven masks are applied to a manufacturing process, and thus, a number of detailed processes are performed. For this reason, the manufacturing process is complicated, and the manufacturing cost increases.

Moreover, when the common electrode top pixel electrode is applied, a transmittance of light in a boundary area between red, green, and blue pixels is higher than a case where a pixel electrode top structure is applied. For this reason, color mixing between the red, green, and blue pixels occurs.

SUMMARY

Accordingly, the present invention is directed to provide an in-cell touch liquid crystal display (LCD) device and method of manufacturing the same that substantially obviate one or more problems due to limitations and disadvantages of the related art.

An aspect of the present invention is directed to provide an in-cell touch LCD device having a pixel electrode top structure and a method of manufacturing the same.

Another aspect of the present invention is directed to provide an in-cell touch LCD device and a method of manufacturing the same, which prevent color mixing between red, green, and blue pixels.

Another aspect of the present invention is directed to provide a manufacturing method which decreases the number of masks used to manufacture an in-cell touch LCD device and simplifies a manufacturing process.

Another aspect of the present invention is directed to provide a manufacturing method which reduces the manufacturing cost of a touch display device.

In addition to the aforesaid objects of the present invention, other features and advantages of the present invention will be described below, but will be clearly understood by those skilled in the art from descriptions below.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these and other advantages and in accordance with the purpose of the invention, as embodied and broadly described herein, there is provided an in-cell touch liquid crystal display (LCD) device including: a thin film transistor (TFT) disposed in each of a plurality of pixel areas; first to fourth passivation layers disposed on the TFT; a common electrode disposed on the second passivation layer; a conductive line disposed on the third passivation layer; a pixel electrode connected to a drain electrode of the TFT and disposed on the fourth passivation layer; and a bridge contact part configured to electrically connect the common electrode to the conductive line.

In another aspect of the present invention, there is provided a method of manufacturing an in-cell touch liquid crystal display (LCD) device including: forming a thin film transistor (TFT) in each of a plurality of pixel areas; forming a source contact part, connected to a source electrode of the TFT, and a drain contact part connected to a drain electrode of the TFT; forming first and second passivation layers on the source contact part and the drain contact part; forming a common electrode on the second passivation layer; forming a third passivation layer on the common electrode; forming a conductive line in an area, overlapping the common electrode, on the third passivation layer; forming a fourth passivation layer on the third passivation layer and the conductive line; forming a first contact hole, which exposes the drain contact part, and forming a pixel electrode in the first contact hole and on the fourth passivation layer; and forming a bridge contact part that connects the common electrode to the conductive line.

It should be noted that embodiments and examples described in context of the in-cell touch liquid crystal display device are analogously valid for the method of manufacturing an in-cell touch liquid crystal display device and vice versa.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings:

FIG. 3 schematically illustrates a process of manufacturing an in-cell touch display device having a common electrode top structure and illustrates the number of masks applied to a manufacturing process;

FIG. 5 schematically illustrates a method of manufacturing an in-cell touch display device according to an embodiment of the present invention and illustrates the number of masks applied to a manufacturing process;

DETAILED DESCRIPTION OF THE INVENTION

Figure 1:
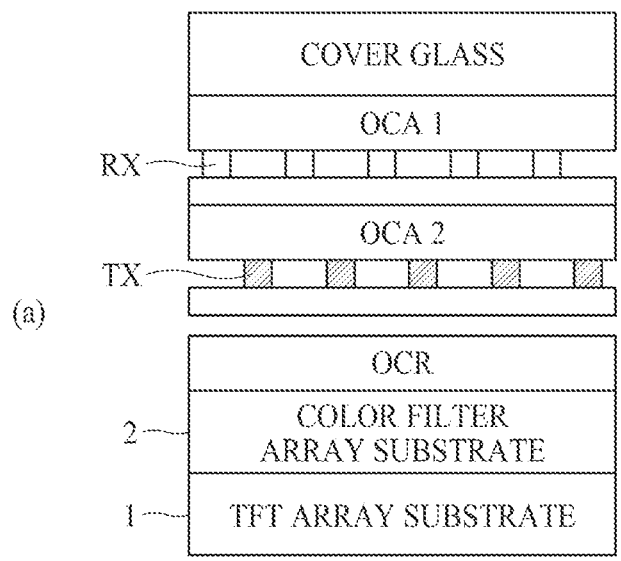
FIG. 1 is a diagram illustrating a related art touch display device to which a touch screen is applied.
Figure 1:
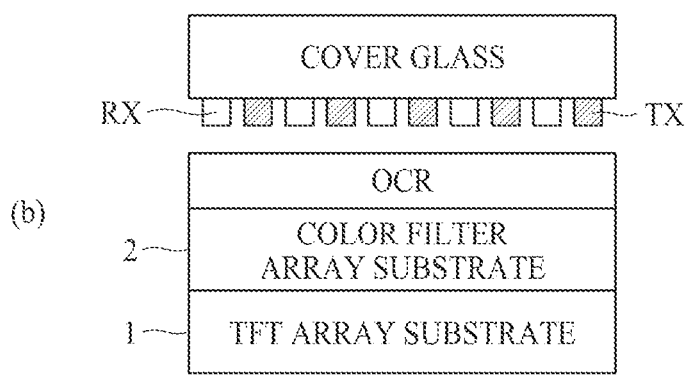
Figure 1:
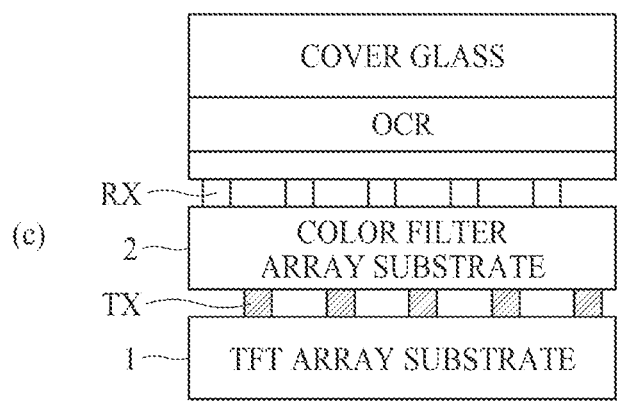
Figure 2:
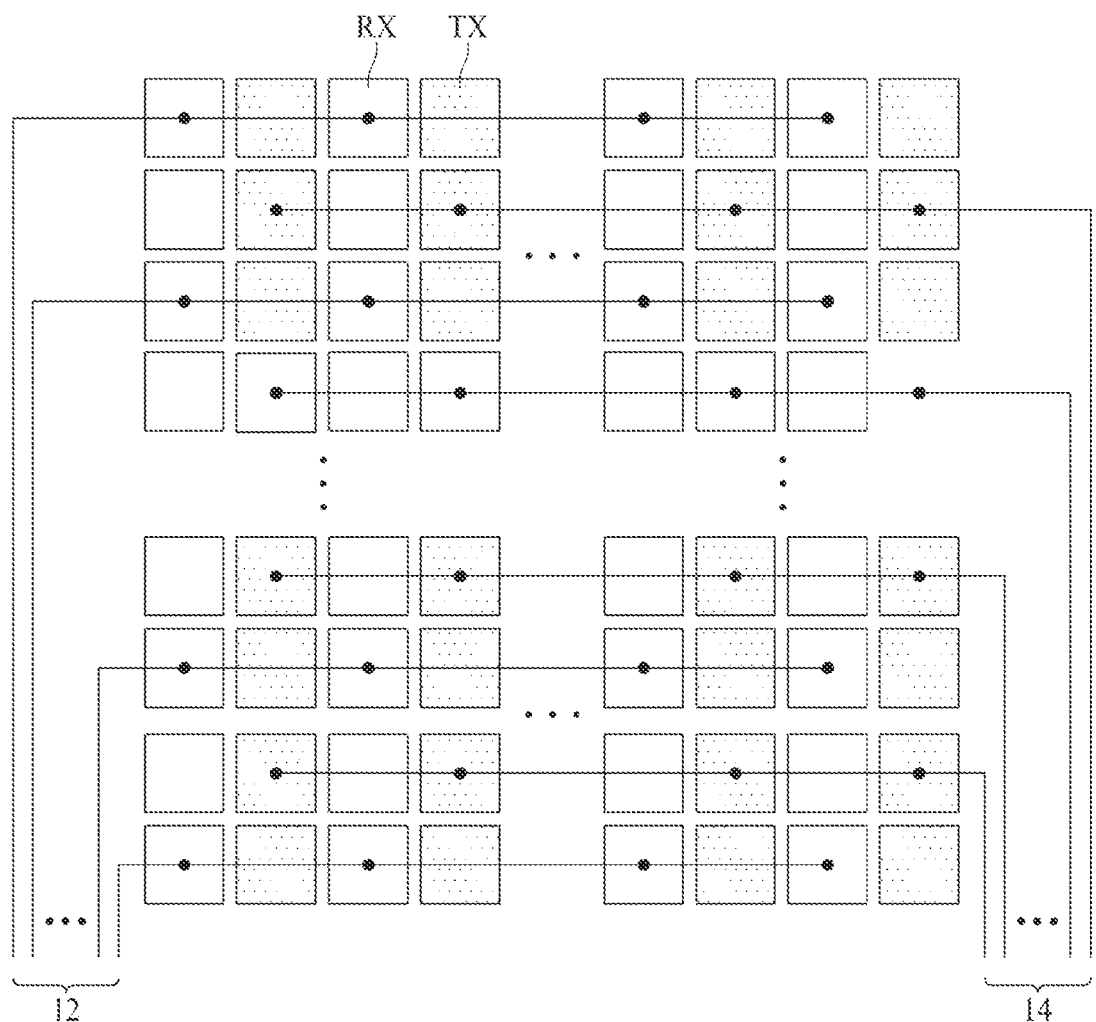
FIG. 2 is a diagram illustrating an in-cell LCD device having a mutual capacitive type.

Reference will now be made in detail to the exemplary embodiments of the present invention, examples of which are illustrated in the accompanying drawings. Wherever possible, the same reference numbers will be used throughout the drawings to refer to the same or like parts.

Like reference numerals refer to like elements throughout. In the below description, elements and functions that are irrelevant to the essentials of the present invention and have been known to those skilled in the art may not be provided.

Advantages and features of the present invention, and implementation methods thereof will be clarified through following embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims.

In the specification, in adding reference numerals for elements in each drawing, it should be noted that like reference numerals already used to denote like elements in other drawings are used for elements wherever possible.

A shape, a size, a ratio, an angle, and a number disclosed in the drawings for describing embodiments of the present invention are merely an example, and thus, the present invention is not limited to the illustrated details. Like reference numerals refer to like elements throughout. In the following description, when the detailed description of the relevant known function or configuration is determined to unnecessarily obscure the important point of the present invention, the detailed description will be omitted. In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as 'on~', 'over~', 'under~' and 'next~', one or more other parts may be disposed between the two parts unless 'just' or 'direct' is used.

In describing a time relationship, for example, when the temporal order is described as 'after~', 'subsequent~', 'next~', and 'before~' a case which is not continuous may be included unless 'just' or 'direct' is used.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present invention.

Features of various embodiments of the present invention may be partially or overall coupled to or combined with each other, and may be variously inter-operated with each other and driven technically as those skilled in the art can sufficiently understand. The embodiments of the present invention may be carried out independently from each other, or may be carried out together in co-dependent relationship.

LCD devices have been variously developed in a twisted nematic (TN) mode, a vertical alignment (VA) mode, an in-plane switching (IPS) mode, and a fringe field switching (FFS) mode according to a scheme of adjusting the alignment of liquid crystal.

Among the modes, the TN mode and the VA mode are modes in which a plurality of pixel electrodes are arranged in a lower substrate, and a plurality of common electrodes are arranged on an upper substrate (color filter array substrate), thereby adjusting the alignment of liquid crystal with vertical electric fields.

The IPS mode is a mode in which the pixel electrodes and the common electrodes are alternately arranged in parallel, and thus, lateral electric fields are respectively generated between the pixel electrodes and the common electrodes, thereby adjusting the alignment of the liquid crystal.

The FFS mode is a mode in which a pixel electrode and a common electrode are formed in plurality to be separated from each other with an insulating layer therebetween. In this case, one electrodes of the pixel electrodes and common electrodes are formed in a plate shape or a pattern, and the other electrodes are formed in a finger shape. The FFS mode is a mode that adjusts the alignment of liquid crystal with fringe fields generated between the pixel electrodes and common electrodes.

An in-cell touch LCD device and a method of manufacturing the same according to an embodiment of the present invention are applied to a thin film transistor (TFT) array substrate (a lower substrate) based on the FFS mode. In the in-cell touch LCD device according to an embodiment of the present invention, a touch electrode (or a touch sensor) that detects a touch is built into the TFT array substrate (a first substrate).

Hereinafter, an in-cell touch LCD device and a method of manufacturing the same according to an embodiment of the present invention will be described in detail with reference to the accompanying drawings.

Figure 4:
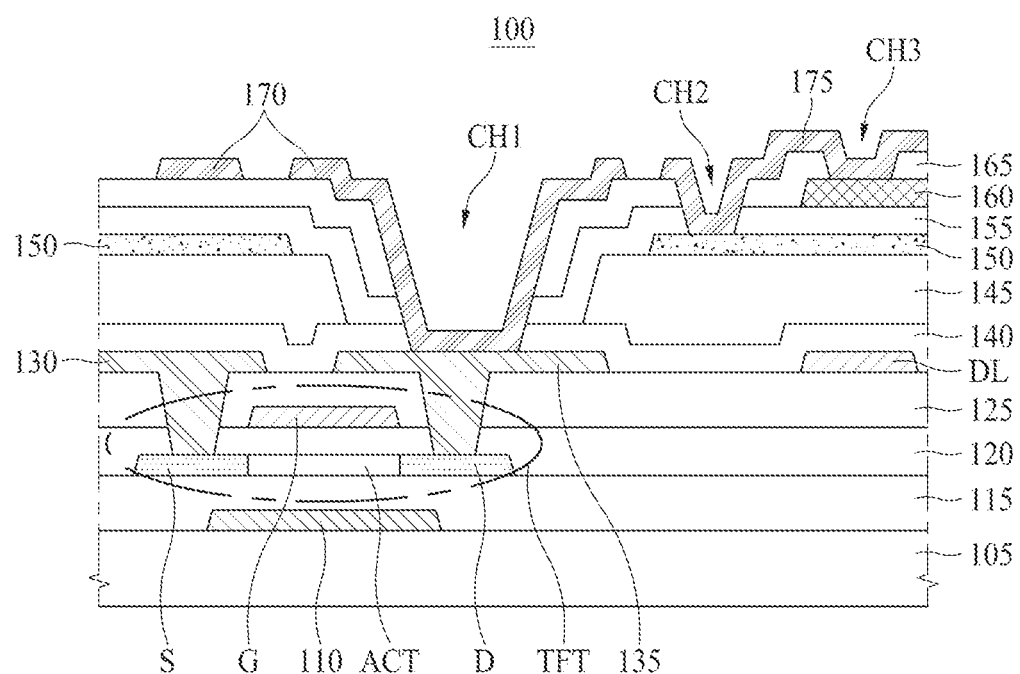
FIG. 4 illustrates an in-cell touch LCD device according to an embodiment of the present invention and illustrates a cross-sectional structure of a pixel disposed on a TFT array substrate.

FIG. 4 illustrates an in-cell touch LCD device according to an embodiment of the present invention and illustrates a structure of one of a plurality of pixels. Hereinafter, the in-cell touch LCD device according to an embodiment of the present invention will be described in detail with reference to FIG. 4.

FIG. 4 illustrates a cross-sectional structure of a pixel disposed on a TFT array substrate and illustrates a structure of the TFT array substrate (a first substrate) based on the FFS mode. FIG. 4 illustrates a pixel electrode top pixel structure and illustrates a touch electrode (a touch sensor) which is internalized in the TFT array substrate in an in-cell touch type.

In FIG. 4, a color filter array substrate (a second substrate), a liquid crystal layer, a backlight unit, and a driving circuit unit are not illustrated. The driving circuit unit may include a timing controller (T-con), a data driver (D-IC), a gate driver (G-IC), a sensing driver, a backlight driver, and a power supply which supplies a driving voltage to a plurality of driving circuits. Here, all or some of the elements of the driving circuit unit may be disposed on a liquid crystal panel in a chip-on glass (COG) type or a chip-on film (a chip-on flexible printed circuit, COF) type.

Although not illustrated in FIG. 4, a plurality of gate lines and a plurality of data lines may be formed on the TFT array substrate to intersect each other. A plurality of pixels may be defined by the plurality of gate lines and the plurality of data lines. Each of the plurality of pixels may include a TFT and a storage capacitor.

Referring to FIG. 4, the TFT array substrate (the first substrate) may include a glass substrate 105, a light shield layer 110, a buffer layer 115, a gate insulator 120, an interlayer dielectric (ILD) 125, a source contact part 130, a drain contact part 135, a first passivation layer (PAS0) 140, a second passivation layer (PAS1) 145, a common electrode 150, a third passivation layer (PAS2) 155, a conductive line 160, a fourth passivation layer (PAS3) 165, a pixel electrode 170, a bridge contact part 175, and a thin film transistor TFT. Here, the thin film transistor TFT may include a gate electrode G, an active layer ACT, a source electrode S, and a drain electrode D.

The light shield layer may be disposed at a portion, corresponding to the active layer ACT of the thin film transistor TFT, on the glass substrate 105. The light shield layer 110 may be formed of opaque metal and prevents light from being irradiated onto the active layer ACT. The light shield layer 110 may be formed of molybdenum (Mo) and aluminum (Al) and may have a thickness of 500 Å to 1,000 Å.

The buffer layer 115 may be formed on the light shield layer 110. The buffer layer 115 may be formed of $SiO_2$ or SiNx and may have a thickness of 2,000 Å to 3,000 Å.

The active layer ACT, source electrode S, and drain electrode D of the thin film transistor TFT may be disposed in an area, overlapping the light shield layer 110, on the buffer layer 115.

The gate insulator 120 may be disposed to cover the active layer ACT, the source electrode S, and the drain electrode D. The gate insulator 120 may be formed of $SiO_2$ and may have a thickness of 1,000 Å to 1,500 Å.

The gate insulator 120 may be formed by depositing tetra ethyl ortho silicate (TEOS) or middle temperature oxide (MTO) in a chemical vapor deposition (CVD) process.

The gate electrode G may be disposed in an area, overlapping the active layer ACT, on the gate insulator 120. In this case, the gate electrode G may be formed of Al or Mo and may have a thickness of 2,000 Å to 3,000 Å. As described above, the thin film transistor TFT may be configured with the active layer ACT, the source electrode S, and the drain electrode D which are disposed under the gate insulator 120 and the gate electrode G disposed on the gate insulator 120. Here, the thin film transistor TFT may be formed in a coplanar top gate structure.

The ILD 125 may be disposed to cover the gate insulator 120 and the thin film transistor TFT. The ILD 125 may be formed of $SiO_2$ or SiNx and may have a thickness of 3,000 Å to 6,000 Å. As another example, the ILD 125 may be formed in a structure where $SiO_2$ (3,000 Å)/SiNx (3,000 Å) are stacked.

The source contact part 130, which is connected to the source electrode S of the thin film transistor TFT through the gate insulator 120 and the ILD 125, may be disposed. The drain contact part 135, which is connected to the drain electrode D of the thin film transistor TFT through the gate insulator 120 and the ILD 125, may be disposed.

The source contact part 130 and the drain contact part 135 may be formed in a multi-layer structure where Mo/Al/Mo is stacked. The source contact part 130 may be connected to a data line DL, and the drain contact part 135 may be connected to the pixel electrode 170.

The first passivation layer (PAS0) 140 may be disposed to cover the ILD 125, the source contact part 130, and the drain contact part 135. The first passivation layer (PAS0) 140 may be formed of $SiO_2$ or SiNx and may have a thickness of 1,000 Å to 2,000 Å.

The second passivation layer (PAS1) 145 may be disposed to cover the first passivation layer (PAS0) 140. The second passivation layer (PAS1) 145 may be formed of photo acryl and may have a thickness of 2.0 μm to 3.0 μm.

The common electrode 150 may be disposed on the second passivation layer (PAS1) 145. The common electrode 150 may be formed of a transparent conductive material such as indium-tin-oxide (ITO), indium-zinc-oxide (IZO), or indium tin zinc oxide (ITZO) and may have a thickness of 500 Å to 1,500 Å.

The third passivation layer (PAS2) 155 may be disposed to cover the common electrode 150. The conductive line 160 may be disposed at a portion, corresponding to the common electrode 150, on the third passivation layer (PAS2) 155.

The conductive line 160 may be electrically connected to the common electrode 150. The conductive line 160 may be formed of Mo or Al and may have a thickness of 1,500 Å to 2,000 Å. The conductive line 160 may be formed in a multi-layer structure where Mo/Al/Mo is stacked.

Here, the conductive line 160 may be disposed to overlap the data line DL. The conductive line 160 may overlap some data lines without overlapping all data lines of red, green, and blue pixels.

For example, when a column spacer is disposed on the data line of the red pixel, the conductive line 160 may be disposed to overlap the data line of the green pixel and the data line of the blue pixel. However, the present embodiment is not limited thereto, and the conductive line 160 may be disposed to overlap one or more of the data lines of the red, green, and blue pixels.

The fourth passivation layer (PAS3) 165 may be disposed to cover the third passivation layer (PAS2) 155 and a portion of the conductive line 160. Each of the third passivation layer (PAS2) 155 and the fourth passivation layer (PAS3) 165 may be formed of $SiO_2$ or SiNx and may have a thickness of 2,000 Å to 3,000 Å.

A first contact hole CH1 may be formed by removing a portion of each of the first to fourth passivation layers (PAS0 to PAS3) 140, 145, 155, and 165 overlapping the drain contact part 135.

The pixel electrode 170 may be disposed on the third passivation layer (PAS2) 155 and in the first contact hole CH1. The pixel electrode 170 may be formed of a transparent conductive material such as ITO, IZO, or ITZO and may have a thickness of 500 Å to 1,500 Å. The pixel electrode 170 may be disposed in a finger shape, and thus, a fringe field may be generated between the common electrode 150 and the pixel electrode 170.

A second contact hole CH2 may be formed by removing a portion of each of the third and fourth passivation layers (PAS2 and PAS3) 155 and 165 disposed on the common electrode 150. Also, a third contact hole CH3 may be formed by removing a portion of the fourth passivation layer (PAS3) 165 disposed on the conductive line 160.

Here, the second contact hole CH2 may be formed in an area overlapping the common electrode 150. The second contact hole CH2 may not overlap the data line DL and the conductive line 160. Also, the third contact hole CH3 may be formed on the data line DL and the conductive line 160. That is, the third contact hole CH3 may be formed in an area overlapping the data line DL and the conductive line 160.

The bridge contact part 175 may be disposed in an area corresponding to the common electrode 150 and the conductive line 160. The bridge contact part 175 may be disposed on the fourth passivation layer 165, in the second contact hole CH2, and in the third contact hole CH3 and may connect the common electrode 150 to the conductive line 160.

Here, the bridge contact part 175 may be formed through the same process as a process of forming the pixel electrode 170 along with the pixel electrode 170. The common electrode 150 may be electrically connected to the conductive line 160 through the bridge contact part 175. The bridge contact part 175 may be disposed in an island pattern, and the pixel electrode 170 may not contact the bridge contact part 175.

Figure 16:
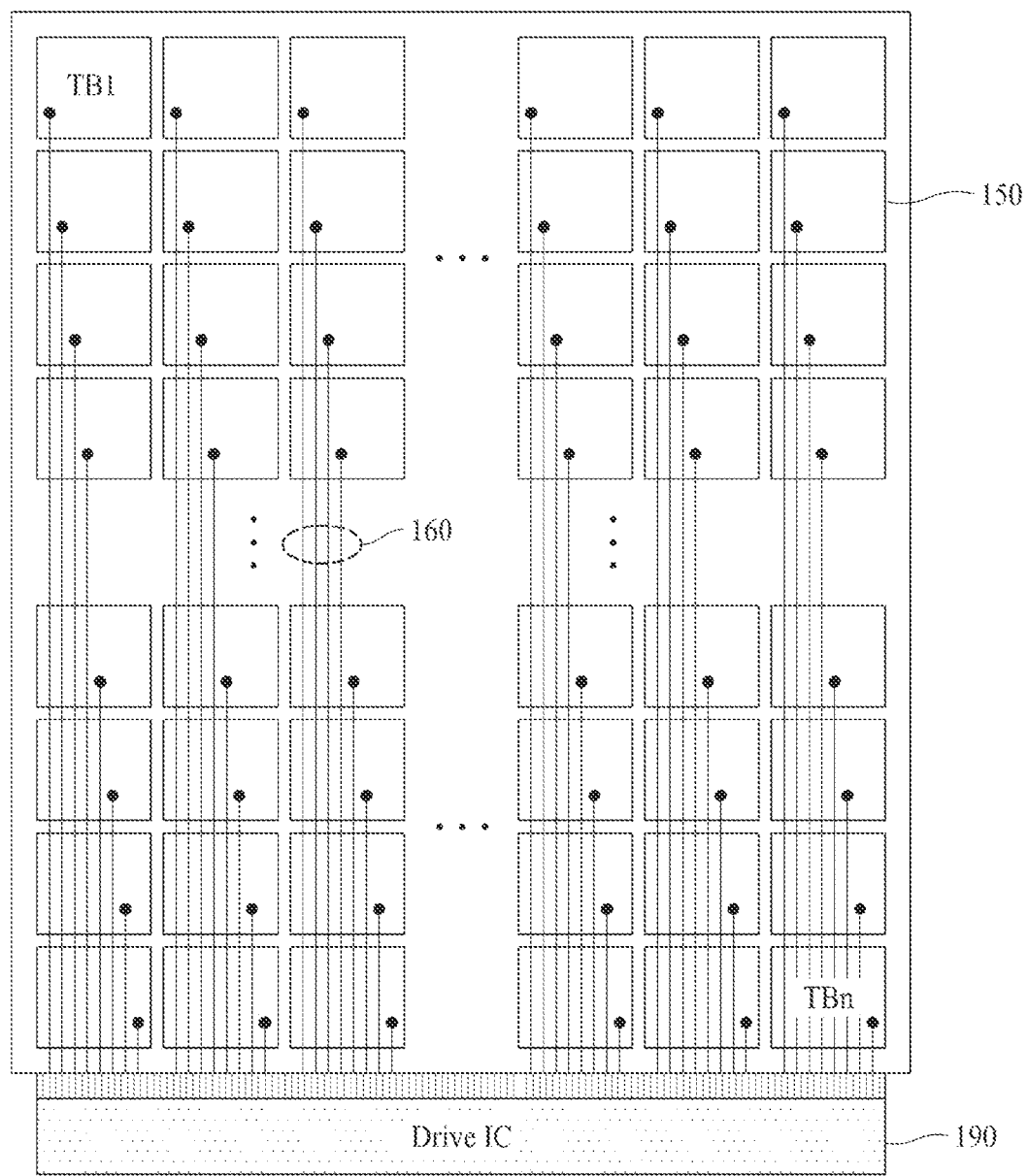
FIG. 16 is a diagram illustrating an example of an arrangement structure of a conductive line which connects a touch electrode to a drive integrated circuit (IC)
Figure 17:
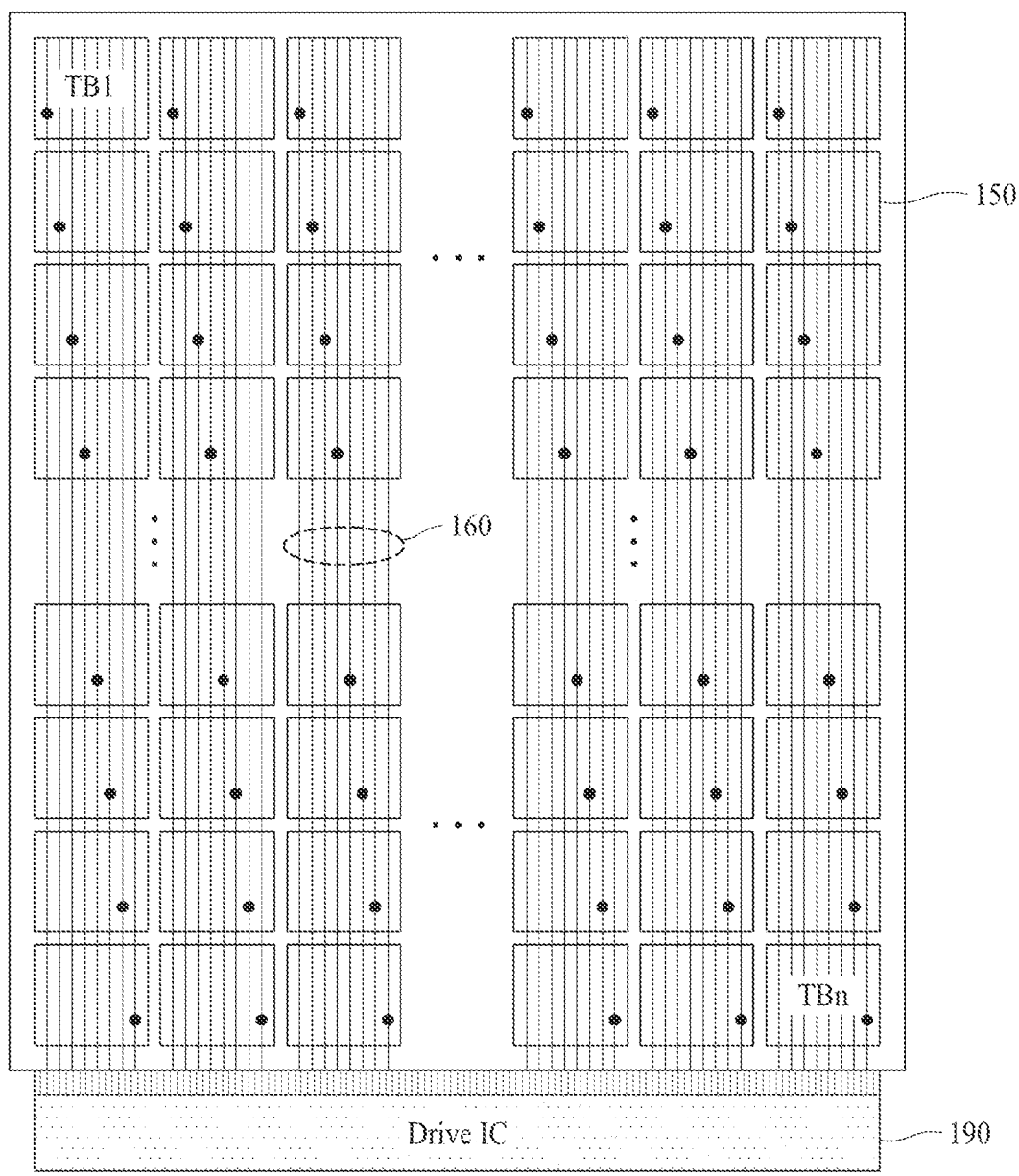
FIG. 17 is a diagram illustrating another example of an arrangement structure of a conductive line which connects a touch electrode to a drive IC.

The conductive line 160 may be electrically connected to the common electrode 150 which is disposed in each of the plurality of pixels, and may be disposed on the data line DL in the liquid crystal panel. The conductive line 160 may be disposed in a bar shape in a direction from a top to a bottom of the liquid crystal panel. Referring to FIGS. 16 and 17, the common electrode 150 and the conductive line 160 connected thereto may be connected to a channel of the drive IC 190 through a link line.

A common voltage or a touch driving signal may be supplied to the common electrode 150 through the conductive line 160. During a display period, the common voltage may be supplied to the common electrode 150 through the conductive line 160. During a touch period (a non-display period), the touch driving signal may be supplied to the common electrode 150 through the conductive line 160. The touch driving signal may be supplied, and then, whether there is a touch and a touched position may be detected by sensing a capacitance, which is generated in the common electrode 150, through the conductive line 160.

In the in-cell touch LCD device according to an embodiment of the present invention, each pixel may be formed in a pixel electrode top structure. Therefore, the present invention provides the in-cell touch LCD device where each pixel is formed in the pixel electrode top structure.

In the pixel electrode top pixel structure applied to the in-cell touch LCD device according to an embodiment of the present invention, a light transmittance of a central portion of a pixel area is high, and a light transmittance is low near each data line. Accordingly, in the in-cell touch LCD device according to an embodiment of the present invention, since a light transmittance is low near each data line, color mixing between the red, green, and blue pixels is prevented.

FIG. 5 schematically illustrates a method of manufacturing an in-cell touch display device according to an embodiment of the present invention and illustrates the number of masks applied to a manufacturing process. In comparison with the related art, the method of manufacturing the in-cell touch display device according to an embodiment of the present invention decreases the number of masks and simplifies a manufacturing process.

As illustrated in FIG. 5, the in-cell touch display device according to an embodiment of the present invention may be manufactured through a manufacturing process using ten masks. Hereinafter, the method of manufacturing the in-cell touch display device according to an embodiment of the present invention will be described in detail with reference to FIGS. 5 and 6 to 15.

FIGS. 6 to 15 are diagrams illustrating a method of manufacturing an in-cell touch display device according to an embodiment of the present invention.

Figure 6:
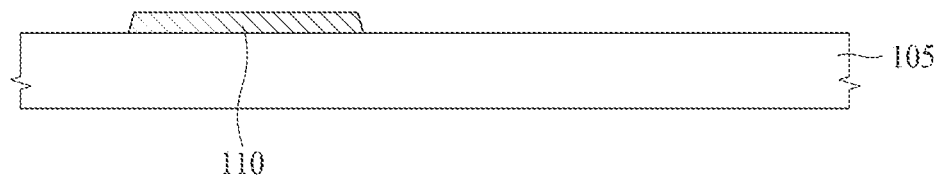
FIGS. 6 to 15 are diagrams illustrating a method of manufacturing an in-cell touch display device according to an embodiment of the present invention.

Referring to FIG. 6, a metal layer may be formed by coating a metal material, which shields light like Mo, on the glass substrate 105.

Subsequently, the light shield layer 110 may be formed in a TFT area by patterning the metal layer through a photolithography and wet etching process using a first mask. In this case, the light shield layer 110 may be formed to a thickness of 500 Å to 1,000 Å and may be aligned with the active layer ACT of the thin film transistor TFT which is formed in a subsequent process.

In FIG. 6, the glass substrate 105 which is applied as a base of the TFT array substrate is illustrated as an example, but may be replaced by a plastic substrate.

Figure 7:
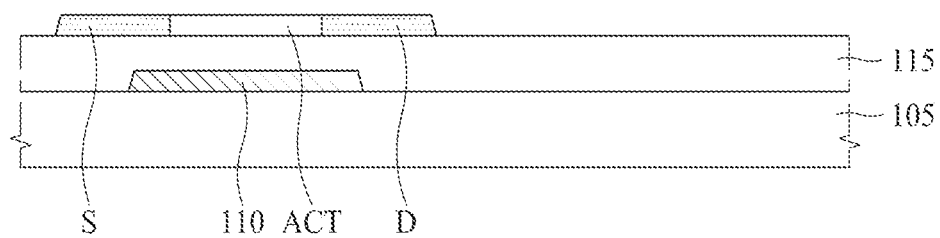

Subsequently, referring to FIG. 7, the buffer layer 115 may be formed of an inorganic material (for example, $SiO_2$ or SiNx) on the glass substrate 105 to cover the light shield layer 110. In this case, the buffer layer 105 may have a thickness of 2,000 Å to 3,000 Å.

Subsequently, a semiconductor layer may be formed by depositing LTPS on the buffer layer 115.

Subsequently, the active layer ACT of the thin film transistor TFT may be formed in an area overlapping the light shield layer 110 by patterning the semiconductor layer through a photolithography and dry etching process using a second mask. In this case, the active layer ACT may be formed to a thickness of 500 Å to 1,500 Å.

Figure 8:
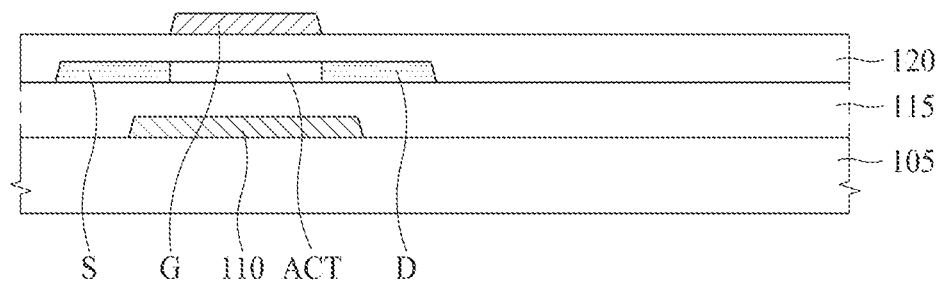

Subsequently, referring to FIG. 8, the gate insulator 120 may be formed on the buffer layer 115 to cover the active layer ACT. The gate insulator 120 may be formed of $SiO_2$ and may have a thickness of 1,000 Å to 1,500 Å.

The gate insulator 120 may be formed by depositing TEOS or MTO in the CVD process.

Subsequently, a metal material may be deposited on the gate insulator 120, and then, the gate electrode G of the thin film transistor TFT may be formed by patterning the metal material through a photolithography and etching process using a third mask.

In this case, the gate electrode G may be formed of Al or Mo to have a thickness of 2,000 Å to 3,000 Å. The gate electrode G may be formed in an area, corresponding to the active layer ACT, on the gate insulator 120. The gate electrode G may be formed of the same material as that of a gate line along with the gate line. Here, the gate line may be arranged in a first direction (for example, a horizontal direction).

The source electrode S and drain electrode D of the thin film transistor TFT may be formed by doping P-type or N-type high-concentration impurities (or P-type high-concentration impurities) on an outer portion of the active layer ACT by using the gate electrode G as a mask.

Here, in forming the gate electrode G, a wet etching process and a dry etching process may be performed, and N-type high-concentration impurities (or P-type high-concentration impurities) may be doped on the active layer ACT between the wet etching process and the dry etching process.

The thin film transistor TFT may be configured with the active layer ACT, the source electrode S, and the drain electrode D which are disposed under the gate insulator 120 and the gate electrode G disposed on the gate insulator 120. Here, the thin film transistor TFT may be formed in the coplanar top gate structure.

Figure 9:
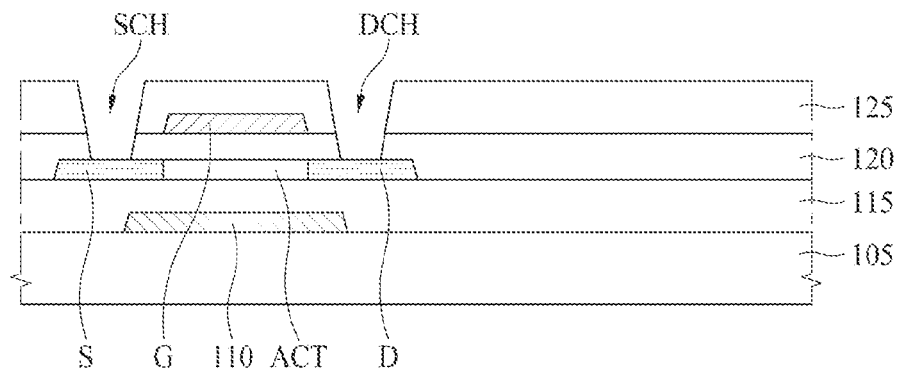

Subsequently, referring to FIG. 9, The ILD 125 may be disposed to cover the gate insulator 120 and the thin film transistor TFT. The ILD 125 may be formed of $SiO_2$ or SiNx and may have a thickness of 3,000 Å to 6,000 Å. As another example, the ILD 125 may be formed in a structure where $SiO_2$ (3,000 Å)/SiNx (3,000 Å) are stacked.

Subsequently, a portion of each of the gate insulator 120 and the ILD 125 overlapping the source electrode S of the thin film transistor TFT may be removed by performing an etching process using a fourth mask. Therefore, a source contact hole SCH exposing the source electrode S of the thin film transistor TFT may be formed. Herewith, a portion of each of the gate insulator 120 and the ILD 125 overlapping the drain electrode D of the thin film transistor TFT may be removed. Therefore, a drain contact hole DCH exposing the drain electrode D of the thin film transistor TFT may be formed.

Figure 10:
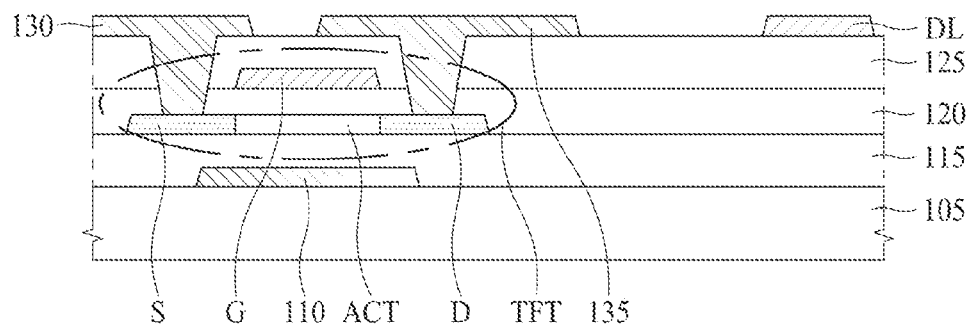

Subsequently, referring to FIG. 10, a metal layer may be formed by coating a metal material on the ILD 125.

Subsequently, a plurality of data lines DL which respectively supply data voltages to the plurality of pixels may be formed by patterning the metal layer through a photolithography and etching process using a fifth mask. Herewith, a metal material may be buried in the source contact hole SCH and the drain contact hole DCH, and thus, the source contact part 130 and the drain contact part 135 may be formed. That is, the data line DL, the source contact part 130, and the drain contact part 135 may be formed in the same mask process. Here, the data lines DL may be arranged in a second direction (for example, a vertical direction) in the liquid crystal panel.

The data line DL, the source contact part 130, and the drain contact part 135 may be formed of Al or Mo and may have a thickness of 2,000 Å to 3,000 Å.

Figure 11:
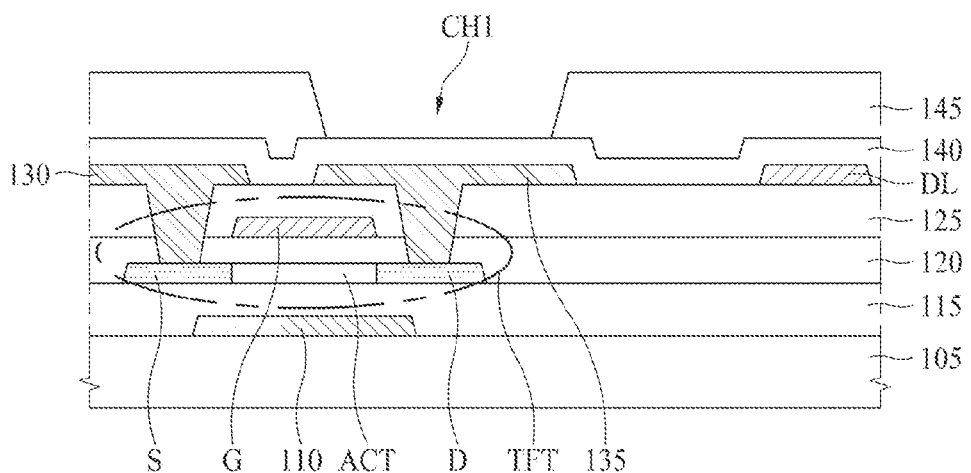

Subsequently, referring to FIG. 11, the first passivation layer (PAS0) 140 may be formed on the ILD 125. The first passivation layer 140 may be disposed to cover the ILD 125, the source contact part 130, and the drain contact part 135. The first passivation layer 140 may be formed of $SiO_2$ or SiNx and may have a thickness of 1,000 Å to 2,000 Å.

Subsequently, the second passivation layer (PAS1) 145 may be disposed to cover the first passivation layer (PAS0) 140 by performing a process using a sixth mask. The second passivation layer (PAS1) 145 may be formed of photo acryl and may have a thickness of 2.0 μm to 3.0 μm.

The second passivation layer (PAS1) 145 may not be formed at a portion overlapping the drain contact part 135. In a subsequent process, the first contact hole CH1 through which the drain contact part 135 contacts the pixel electrode may be formed at a portion where the second passivation layer (PAS1) 145 is not formed. In this case, the first passivation layer (PAS0) 140 may not be removed but may be left as-is.

Figure 12:
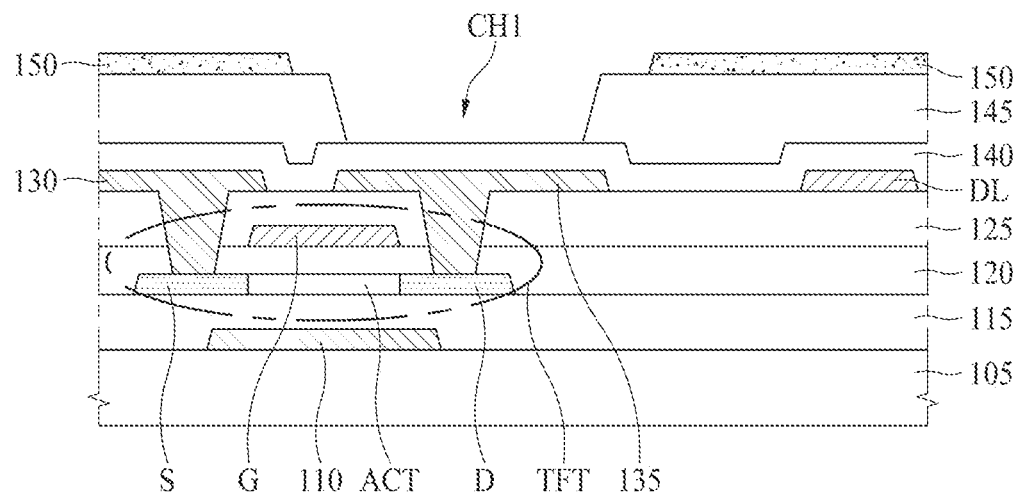

Subsequently, referring to FIG. 12, a transparent conductive material may be coated on the second passivation layer (PAS1) 145. Subsequently, the common electrode 150 may be formed on the second passivation layer (PAS1) 145 by performing a lithography and etching process using a seventh mask.

The common electrode 150 may be formed of a transparent conductive material such as ITO, IZO, or ITZO and may have a thickness of 500 Å to 1,500 Å.

Figure 13:
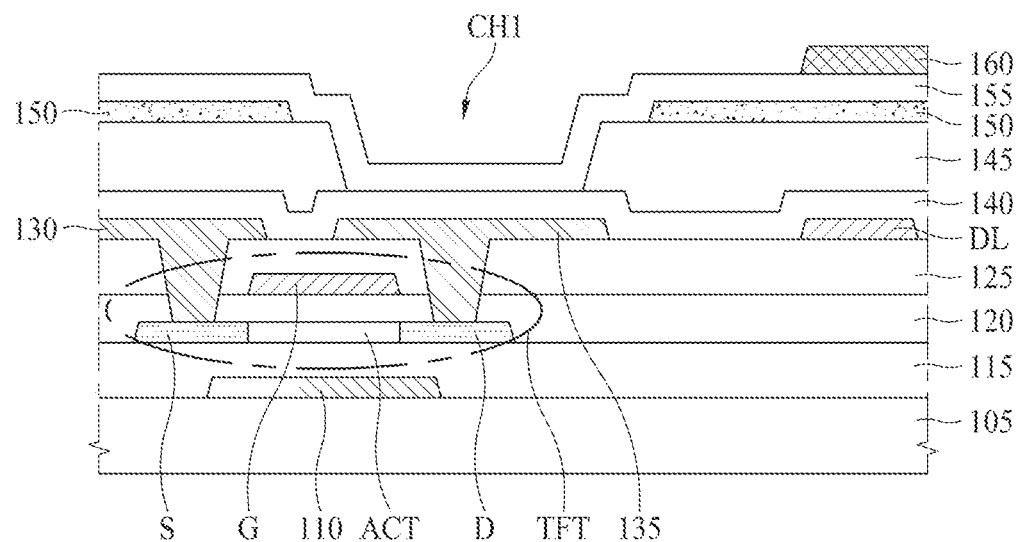

Subsequently, referring to FIG. 13, the third passivation layer (PAS2) 155 may be disposed to cover the common electrode 150. The third passivation layer 155 may be formed of $SiO_2$ or SiNx and may have a thickness of 2,000 Å to 3,000 Å.

Subsequently, a metal material may be coated on the third passivation layer 155. Subsequently, the conductive line 160 may be formed by performing an etching process using an eighth mask. The conductive line 160 may be formed at a portion, overlapping the common electrode 150, on the third passivation layer (PAS2) 155.

The conductive line 160 may be formed of Mo or Al and may have a thickness of 1,500 Å to 2,000 Å. The conductive line 160 may be formed in a multi-layer structure where Mo/Al/Mo is stacked.

Here, the conductive line 160 may be formed to overlap the data line DL and at least partially formed above the data line DL, i.e. over the data line DL in a (straight) direction to the top of the display device where, e.g., a cover glass of the display device is formed, and may connect a plurality of common electrodes which are adjacent to each other in a vertical direction in the liquid crystal panel. The conductive line 160 may not overlap all the data lines of the red, green, and blue pixels. When the column spacer is disposed on the data line of the red pixel, the conductive line 160 may be disposed to overlap the data line of the green pixel and the data line of the blue pixel. However, the present embodiment is not limited thereto, and the conductive line 160 may be disposed to overlap one or more of the data lines of the red, green, and blue pixels.

Figure 14:
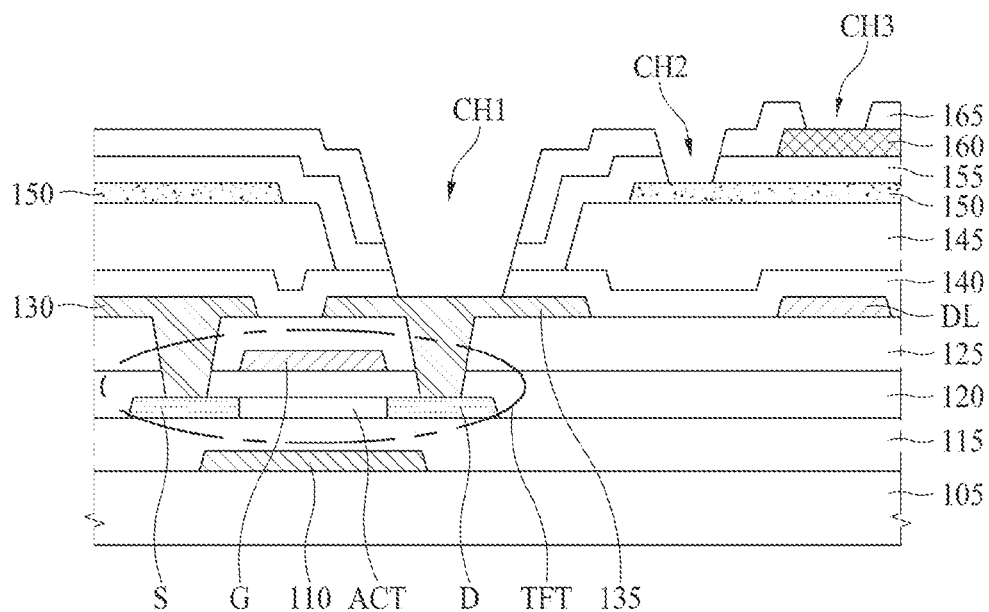

Subsequently, referring to FIG. 14, the fourth passivation layer (PAS3) 165 may be disposed to cover the third passivation layer (PAS2) 155 and the conductive line 160.

Subsequently, a portion of the first passivation layer (PAS0) 140, the third passivation layer (PAS2) 155, and the fourth passivation layer (PAS3) 165 overlapping the drain contact part 135 may be removed by performing a photolithography and etching process using a ninth mask. Therefore, the first contact hole CH1 exposing the drain contact part 135 may be formed.

Herewith, a portion of each of the third passivation layer (PAS2) 155 and the fourth passivation layer (PAS3) 165 overlapping the common electrode 150 may be removed by performing the photolithography and etching process using the ninth mask. Therefore, the second contact hole CH2 exposing a portion of the common electrode 150 may be formed.

Here, the second contact hole CH2 may be formed in an area overlapping the common electrode 150. The second contact hole CH2 may not overlap the data line DL and the conductive line 160.

Herewith, a portion of the fourth passivation layer (PAS3) 165 overlapping the conductive line 160 may be removed by performing the photolithography and etching process using the ninth mask. Therefore, the third contact hole CH3 exposing a portion of the conductive line 160 may be formed.

Here, the third contact hole CH3 may be formed on the data line DL and the conductive line 160. That is, the third contact hole CH3 may be formed in an area overlapping the data line DL and the conductive line 160.

As described above, the first to third contact holes CH1 to CH3 may be formed at a time by performing the photolithography and etching process using the ninth mask.

Here, the first contact hole CH1 is for electrically connecting the drain electrode D of the thin film transistor TFT to the pixel electrode. Also, the second contact hole CH2 and the third contact hole CH3 are for electrically connecting the common electrode 150 to the conductive line 160.

Figure 15:
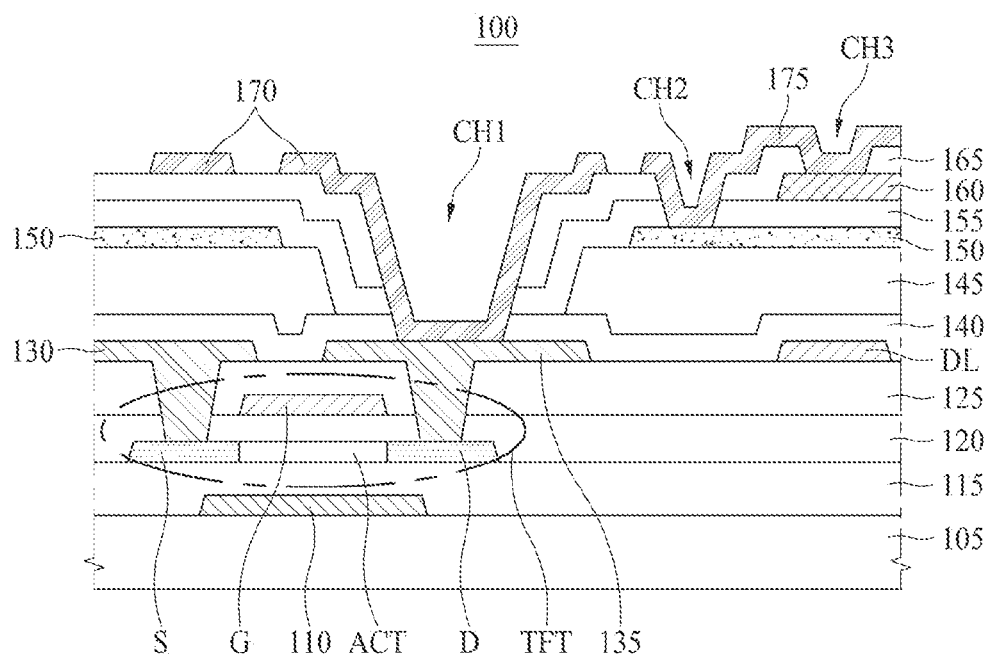

Subsequently, referring to FIG. 15, a transparent conductive material may be coated on the fourth passivation layer (PAS3) 165. Subsequently, the pixel electrode 170 may be formed on the fourth passivation layer (PAS3) 165 and in the first contact hole CH1 by performing a photolithography and etching process using a tenth mask. The pixel electrode 170 may be connected to the drain contact part 135 in the first contact hole CH1, and thus, the drain electrode D of the thin film transistor TFT may be electrically connected to the pixel electrode 170.

Here, the pixel electrode 170 may be formed of a transparent conductive material such as ITO, IZO, or ITZO and may have a thickness of 500 Å to 1,500 Å. The pixel electrode 170 may be disposed in a finger shape, and thus, a fringe field may be generated between the common electrode 150 and the pixel electrode 170.

Herewith, when forming the pixel electrode 170, the bridge contact part 175 may be formed in an area corresponding to the common electrode 150 and the conductive line 160. The bridge contact part 175 may be formed on the fourth passivation layer (PAS3) 165 where the common electrode 150 and the conductive line 160 are formed, in the second contact hole CH2, and in the third contact hole CH3 and may electrically connect the common electrode 150 to the conductive line 160. The bridge contact part 175 may be formed in an island pattern, and the pixel electrode 170 may not contact the bridge contact part 175.

Since the third passivation layer (PAS2) 155 is formed between the common electrode 150 and the conductive line 160, the common electrode 150 may not be directly connected to the conductive line 160. However, since the bridge contact part 175 is formed in the second contact hole CH2 and the third contact hole CH3, the common electrode 150 may be electrically connected to the conductive line 160.

The method of manufacturing the in-cell touch LCD device according to an embodiment of the present invention may form each pixel in the pixel electrode top pixel structure. In the pixel electrode top pixel structure, a light transmittance of a central portion of a pixel area is high, and a light transmittance is low near each data line. Accordingly, the in-cell touch LCD device according to an embodiment of the present invention prevents color mixing between the pixels.

Moreover, the method of manufacturing the in-cell touch LCD device according to the embodiments of the present invention decreases the number of masks used to manufacture the in-cell touch LCD device and simplifies a manufacturing process.

A related art method of manufacturing an in-cell touch LCD device needs eleven masks in manufacturing a TFT array substrate. On the other hand, the method of manufacturing the in-cell touch LCD device according to the embodiments of the present invention manufactures the TFT array substrate by using ten masks, thereby decreasing the number of masks in comparison with the related art. Also, a detailed manufacturing process is simplified, and thus, a manufacturing time and the manufacturing cost are reduced.

FIG. 16 is a diagram illustrating an example of an arrangement structure of a conductive line which connects a touch electrode to a drive IC, and FIG. 17 is a diagram illustrating another example of an arrangement structure of a conductive line which connects a touch electrode to a drive IC.

In FIGS. 16 and 17, it is illustrated that the touch electrode and conductive line of the in-cell touch LCD device according to an embodiment of the present invention are arranged in a self-capacitive in-cell touch type.

Referring to FIGS. 16 and 17, in the in-cell touch LCD device according to an embodiment of the present invention, a plurality of the conductive lines 160 may be formed in an active area of the liquid crystal panel, and the conductive line 160 may be vertically arranged to overlap the data line DL. Therefore, a bezel area is prevented from being enlarged by routing of the conductive line 160.

For example, as illustrated in FIG. 16, the conductive line 160 may be disposed from a portion, connected to the common electrode 150, to a lower end of the active area. As another example, as illustrated in FIG. 17, the conductive line 160 may be disposed from an upper end to the lower end of the active area. When the conductive line 160 is formed from the upper end to the lower end of the conductive line 160, a capacitance value is uniformed by the routing of the conductive line 160, thereby increasing an accuracy of touch sensing.

According to the embodiments of the present invention, the in-cell touch LCD device having the pixel electrode top structure and the method of manufacturing the same are provided.

Moreover, the in-cell touch LCD device according to the embodiments of the present invention prevents color mixing between red, green, and blue pixels.

Moreover, the method of manufacturing the in-cell touch LCD device according to the embodiments of the present invention decreases the number of masks used to manufacture the in-cell touch LCD device and simplifies a manufacturing process.

Moreover, the method of manufacturing the in-cell touch LCD device according to the embodiments of the present invention reduces the manufacturing cost of the in-cell touch LCD device.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An in-cell touch liquid crystal display (LCD) device comprising:
    a thin film transistor (TFT) disposed in each of a plurality of pixel areas;
    a first passivation, a second passivation layer, a third passivation layer, and a fourth passivation layer disposed on the TFT;
    a common electrode disposed on the second passivation layer;
    a conductive line disposed on the third passivation layer;
    a pixel electrode connected to a drain electrode of the TFT and disposed on the fourth passivation layer; and
    a bridge contact part configured to electrically connect the common electrode to the conductive line.

2. The in-cell touch LCD device of claim 1, wherein the bridge contact part is connected to the common electrode through the third passivation layer and the fourth passivation layer.

3. The in-cell touch LCD device of claim 1, wherein the bridge contact part is connected to the conductive line through the fourth passivation layer.

4. The in-cell touch LCD device of claim 3, wherein the bridge contact part is disposed in a contact hole exposing the common electrode and is connected to the common electrode.

5. The in-cell touch LCD device of claim 4, wherein the bridge contact part is disposed in another contact hole exposing the conductive line and is connected to the conductive line.

6. The in-cell touch LCD device of claim 5, wherein the first passivation layer is disposed on the TFT, the second passivation layer is disposed over the first passivation layer, the third passivation layer is disposed over the second passivation layer and the fourth passivation layer is disposed over the third passivation layer.

7. The in-cell touch LCD device of claim 6, wherein the first to fourth passivation layers extend to an area next to the TFT where the conductive line and the common electrode are arranged.

8. The in-cell touch LCD device of claim 7, wherein the area next to the TFT is an area between the TFT and a further TFT of the in-cell touch LCD device.

9. The in-cell touch LCD device of claim 1, wherein the first passivation layer is formed on a data line connected to the TFT and wherein the first passivation layer is configured to insulate the data line.

10. The in-cell touch LCD device of claim 1, wherein the bridge contact part extends through the third passivation layer and the fourth passivation layer.

11. The in-cell touch LCD device of claim 9, wherein the conductive line is formed to overlap with a data line connected to the TFT.

12. The in-cell touch LCD device of claim 1, wherein the bridge contact part is insulated from the pixel electrode.

13. A method of manufacturing an in-cell touch liquid crystal display (LCD) device, the method comprising:
    forming a thin film transistor (TFT) in each of a plurality of pixel areas;
    forming a source contact part, connected to a source electrode of the TFT, and a drain contact part connected to a drain electrode of the TFT;
    forming a first passivation layer and a second passivation layer on the source contact part and the drain contact part;
    forming a common electrode on the second passivation layer;
    forming a third passivation layer on the common electrode;
    forming a conductive line in an area, overlapping the common electrode, on the third passivation layer;
    forming a fourth passivation layer on the third passivation layer and the conductive line;
    forming a first contact hole, which exposes the drain contact part, and forming a pixel electrode in the first contact hole and on the fourth passivation layer; and
    forming a bridge contact part that connects the common electrode to the conductive line.

14. The method of claim 13, further comprising:
- forming a second contact hole by removing the third passivation layer and the fourth passivation layer disposed in an area overlapping the common electrode; and
- forming a third contact hole by removing the fourth passivation layer disposed in an area overlapping the conductive line.

15. The method of claim 13, wherein,
- the pixel electrode and the bridge contact part are formed in a manufacturing process using a same material and a same mask,
- the bridge contact part is formed in an island pattern, and
- the pixel electrode does not contact the bridge contact part.

* * * * *